United States Patent
Yang

(10) Patent No.: US 7,550,332 B2
(45) Date of Patent: Jun. 23, 2009

(54) NON-PLANAR TRANSISTOR HAVING GERMANIUM CHANNEL REGION AND METHOD OF MANUFACTURING THE SAME

(75) Inventor: Jeong-hwan Yang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 272 days.

(21) Appl. No.: 11/731,259

(22) Filed: Mar. 30, 2007

(65) Prior Publication Data

US 2008/0050865 A1 Feb. 28, 2008

Related U.S. Application Data

(62) Division of application No. 10/997,440, filed on Nov. 23, 2004, now Pat. No. 7,214,993.

(30) Foreign Application Priority Data

Nov. 24, 2003 (KR) ............... 10-2003-0083623

(51) Int. Cl.
*H01L 21/84* (2006.01)
(52) U.S. Cl. ............ 438/152; 438/164; 257/E21.415
(58) Field of Classification Search ............ 438/152, 438/164; 257/E21.415
See application file for complete search history.

(56) References Cited

U.S. PATENT DOCUMENTS

| 6,413,802 | B1 | 7/2002 | Hu et al. |
|---|---|---|---|
| 6,458,662 | B1 | 10/2002 | Yu |
| 6,475,869 | B1 | 11/2002 | Yu |
| 6,642,090 | B1 | 11/2003 | Fried et al. |
| 6,774,390 | B2 | 8/2004 | Sugiyama et al. |
| 6,909,151 | B2 | 6/2005 | Hareland et al. |
| 7,005,330 | B2 | 2/2006 | Yeo et al. |
| 7,199,417 | B2 * | 4/2007 | Forbes ............ 257/301 |
| 2003/0102497 | A1 | 6/2003 | Fried et al. |
| 2003/0227036 | A1 | 12/2003 | Sugiyama et al. |
| 2004/0036127 | A1 | 2/2004 | Chau et al. |
| 2004/0094807 | A1 | 5/2004 | Chau et al. |
| 2004/0150029 | A1 | 8/2004 | Lee |
| 2004/0157353 | A1 * | 8/2004 | Ouyang et al. ............ 438/38 |

(Continued)

FOREIGN PATENT DOCUMENTS

JP 2003-243667 8/2003

(Continued)

OTHER PUBLICATIONS

Yang, Fu-Liang, et al., "35nm CMOS FinFETs," 2002 Symposium On VLSI Technology Digest of Technical Papers, pp. 104-105.

*Primary Examiner*—Ngan Ngo
(74) *Attorney, Agent, or Firm*—Mills & Onello LLP

(57) ABSTRACT

Provided is a non-planar transistor with a multi-gate structure that includes a germanium channel region, and a method of manufacturing the same. The non-planar transistor includes a silicon body and a channel region that covers exposed surfaces of the silicon body. The channel region is formed of a germanium layer and includes a first channel region and a second channel region. In order to form the germanium channel region, a mesa type active region is formed on the substrate, and a germanium layer is formed to cover two sidewalls and an upper surface of the active region.

14 Claims, 3 Drawing Sheets

U.S. PATENT DOCUMENTS

| | | |
|---|---|---|
| 2005/0029583 A1 | 2/2005 | Popp et al. |
| 2005/0035415 A1* | 2/2005 | Yeo et al. .................... 257/401 |
| 2005/0063215 A1* | 3/2005 | Yang .......................... 365/154 |
| 2005/0156171 A1* | 7/2005 | Brask et al. ................... 257/72 |
| 2005/0212056 A1 | 9/2005 | Iwamatsu et al. |
| 2005/0242406 A1 | 11/2005 | Hareland et al. |
| 2006/0001109 A1* | 1/2006 | Shaheen et al. ............. 257/401 |
| 2007/0241367 A1* | 10/2007 | Ouyang et al. ............. 257/190 |
| 2008/0237637 A1* | 10/2008 | Ouyang et al. ............. 257/190 |

FOREIGN PATENT DOCUMENTS

| | | |
|---|---|---|
| KR | 2002-0035986 | 5/2002 |

* cited by examiner

NON-PLANAR TRANSISTOR HAVING GERMANIUM CHANNEL REGION AND METHOD OF MANUFACTURING THE SAME

RELATED APPLICATION

This application is a divisional of U.S. application Ser. No. 10/997,440, filed on Nov. 23, 2004, which relies for priority upon Korean patent application number 2003-83623, filed in the Korean Intellectual Property Office on Nov. 24, 2003, the contents of which are incorporated herein in their entirety by reference.

BACKGROUND OF THE INVENTION

1. Field of the Invention

The present invention relates to a semiconductor device and a method of manufacturing the same, and more particularly, to a non-planar transistor having a germanium channel region and a method of manufacturing the same.

2. Description of the Related Art

In order to improve the speed and operation, and reduce the power consumption of a semiconductor device, attempts have been made to increase device density of an integrated circuit by reducing the size of individual transistors of the integrated circuit while maintaining the driving capacity of the transistors. Technology for reducing the size of the semiconductor device is necessary to increase the device density.

A multi-gate transistor in which a gate is formed on a fin shaped silicon body formed using a silicon-on-insulator (SOI) wafer is suggested as a scaling technology of field effect transistors (FETs) to increase the device density of a complementary metal oxide semiconductor (CMOS) structure. Hereafter, the fin shaped silicon body will be referred to as a silicon fin body. The multi-gate transistor using the silicon fin body is used for scaling down the CMOS and provides excellent sub-threshold characteristics and current control capacity without increasing the length of the gate by adopting a complete depletion type SOI structure. In addition, the multi-gate transistor using the silicon fin body efficiently controls a short channel effect (SCE), and thus, the potential of a channel region is not affected by a drain voltage. "35 nm CMOS FinFETs", VLSI 2002, Fu-Liang Yang et al., U.S. Pat. Nos. 6,413,802, and 6,642,090 provide descriptions of the advantages of the multi-gate transistor using the silicon fin body. These patents are incorporated herein in their entirety by reference.

Another method of scaling the size of a device without affecting the performance of the CMOS device is to improve the mobility of a carrier, that is, an electron or a hole, within a semiconductor material. For example, U.S. Patent Application No. 2003/0102497 A1, incorporated herein in its entirety by reference, discloses a method of optimizing the mobility in a CMOS Fin FET by using various crystal planes.

However, the conventional multi-gate transistor using the silicon fin body limits the material used to compose the channel region to silicon, thus limiting the possibilities for improving the carrier mobility in the channel region.

SUMMARY OF THE INVENTION

The present invention provides a non-planar transistor that improves the integration and performance of a semiconductor device and improves a carrier mobility in a channel by adopting a multi-gate structure, which is realized in a fin body active region.

The present invention also provides a method of manufacturing a non-planar transistor including a channel with improved carrier mobility in a multi-gate transistor, which is realized in a fin body active region.

According to an aspect of the present invention, there is provided a non-planar transistor comprising a silicon body having two sidewalls and an upper surface formed on a substrate, and a channel region covering exposed surfaces on the silicon body. The channel region has a larger carrier mobility than the silicon body. A gate is formed on the channel region, and a gate dielectric layer is interposed between the channel region and the gate. In addition, source/drain regions are formed on the silicon body on both sides of the channel region.

In one embodiment, the channel region is formed of germanium (Ge) or SiGe

The channel region includes a first channel region and a second channel region, which are formed on and cover the two sidewalls of the silicon body.

It is preferable that the channel region covers both sidewalls and the upper surface of the silicon body. Here, the channel region includes a first channel region and a second channel region, which cover the of the silicon body and extend along surfaces perpendicular to a main surface of the substrate, respectively, and a third channel region, which covers the upper surface of the silicon body and extends along a surface parallel to the main surface of the substrate. The gate includes a first gate formed on the first channel region, a second gate formed on the second channel region, and a third gate formed on the third channel region. The first gate, the second gate, and the third gate are electrically interconnected.

In one embodiment, the gate dielectric layer is formed of a high dielectric material selected from $Ge_xO_yN_z$, $Ge_xSi_yO_z$, $SiO_2$, $SiON$, $Si_3N_4$, and metal oxide, or a combination thereof. The gate dielectric layer is formed of a high dielectric material selected from $HfO_2$, $ZrO_2$, $Al_2O_3$, $TiO_2$, and $Ta_2O_5$.

In one embodiment, the gate is formed of a conductive polysilicon layer, a metal layer, a metal nitride layer, or a metal silicide layer.

In one embodiment, the gate is formed with a stacked structure including a conductive polysilicon layer and a first metal silicide layer thereon.

The non-planar transistor can further include a second metal silicide layer formed on the source/drain regions.

In one embodiment, the silicon body is formed on an insulating layer on the substrate. The insulating layer can be formed of a buried oxide film of a silicon-on-insulator (SOI) substrate, and the silicon body is formed of an SOI layer.

According to another aspect of the present invention, there is provided a non-planar transistor comprising a silicon body formed on a substrate and having two sidewalls and an upper surface. A channel region of a Ge layer is formed on the silicon body. A gate is formed on the channel region, and a gate dielectric layer is interposed between the channel region and the gate. In addition, source/drain regions are formed on both sides of the channel region, on the silicon body.

In one embodiment, the channel region includes a first channel region and a second channel region, which respectively cover both sidewalls of the silicon body.

In one embodiment, the Ge layer covers both sidewalls and the upper surface of the silicon body.

In one embodiment, the channel region includes a first channel region and a second channel region, which cover both sidewalls of the silicon body and extend along surfaces perpendicular to a main surface of the substrate, respectively, and a third channel region, which covers the upper surface of the silicon body and extends along a surface perpendicular to the main surface of the substrate. The gate can include a first gate formed on the first channel region, a second gate formed on the second channel region, and a third gate formed on the third channel region. The first gate, the second gate, and the third gate are electrically interconnected.

In one embodiment, the gate dielectric layer is formed of a high dielectric material selected from $Ge_xO_yN_z$, $Ge_xSi_yO_z$, $SiO_2$, SiON, $Si_3N_4$, or metal oxide, or a combination thereof. The gate dielectric layer can be formed of a high dielectric material selected from $HfO_2$, $ZrO_2$, $Al_2O_3$, $TiO_2$, and $Ta_2O_5$.

In one embodiment, the gate is formed of a conductive polysilicon layer, a metal layer, a metal nitride layer, or a metal silicide layer.

In one embodiment, the gate is formed with a stacked structure including a conductive polysilicon layer and a first metal silicide layer thereon.

The non-planar transistor can further include a second metal silicide layer formed on the source/drain regions.

The silicon body can be formed on an insulating layer on the substrate. In one embodiment, the insulating layer is formed of a buried oxide film of an SOI substrate, and the silicon body is formed of an SOI layer.

According to still another aspect of the present invention, there is provided a method of manufacturing a non-planar transistor comprising forming a mesa type active region having two sidewalls and an upper surface, on a substrate. Thereafter, a channel region, which covers three surfaces of the active region, is formed. A gate dielectric layer is formed on the channel region, and a gate is formed on the gate dielectric layer. Source/drain regions are formed within the active region.

It is preferable that the active region is formed of an SOI layer.

In one embodiment, the channel region is formed of a material that provides a greater carrier mobility than the active region. The channel region can be formed of Ge or SiGe.

In one embodiment, the channel region includes a first channel region and a second channel region, which respectively cover the two sidewalls of the active region.

The channel region is formed on the surface of the active region by a selective epitaxy growth method. The channel region can include a first channel region and a second channel region, which cover the two sidewalls of the active region and extend along surfaces perpendicular to a main surface of the substrate, and a third channel region, which covers the upper surface of the active region and extends along a surface parallel to the main surface of the substrate.

In one embodiment, the gate is formed to include a first gate formed on the first channel region, a second gate formed on the second channel region, and a third gate formed on the third channel region.

The gate dielectric layer can be formed of $Ge_xO_yN_z$, $Ge_xSi_yO_z$, $SiO_2$, SiON, $Si_3N_4$, $HfO_2$, $ZrO_2$, $Al_2O_3$, $TiO_2$, $Ta_2O_5$ or a combination thereof. Here, the gate dielectric layer is formed of a layer grown from the surface of the channel region by a thermal oxide method, or a layer formed by a chemical vapor deposition (CVD) method or an atomic layer deposition (ALD) method.

In one embodiment, the gate covers the two sidewalls and the upper surface of the active region with the channel region and the gate dielectric layer interposed between the gate and the active region.

In one embodiment, the gate is formed of a conductive polysilicon layer, a metal layer, a metal nitride layer, or a metal silicide layer.

In the non-planar transistor having a tri-gate structure, an SCE can be prevented by controlling the gate even when the length of the gate is reduced due to scaling of the semiconductor device. In addition, the tri-gate structure adopts a germanium (Ge) channel, so that a carrier mobility in the channel is improved.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention. In the drawings, the sizes and the thicknesses of layers and regions are exaggerated for clarity.

DETAILED DESCRIPTION OF THE INVENTION

Figure 1:
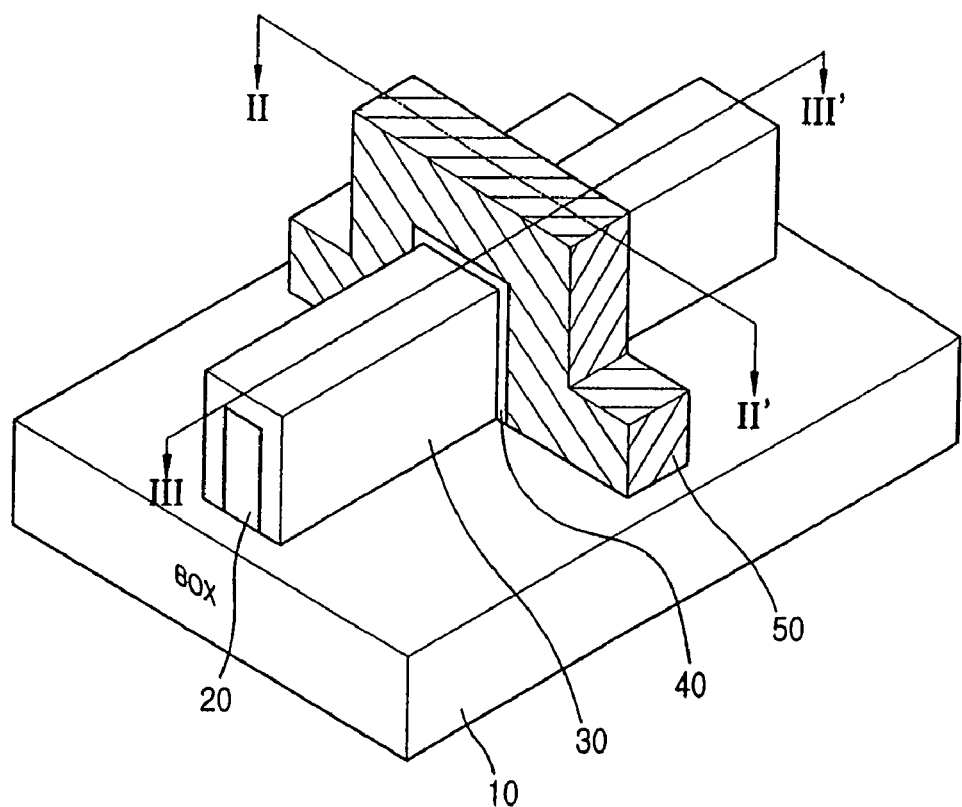
FIG. 1 is a perspective view illustrating the structure of a non-planar transistor according to a first embodiment of the present invention.
Figure 2:
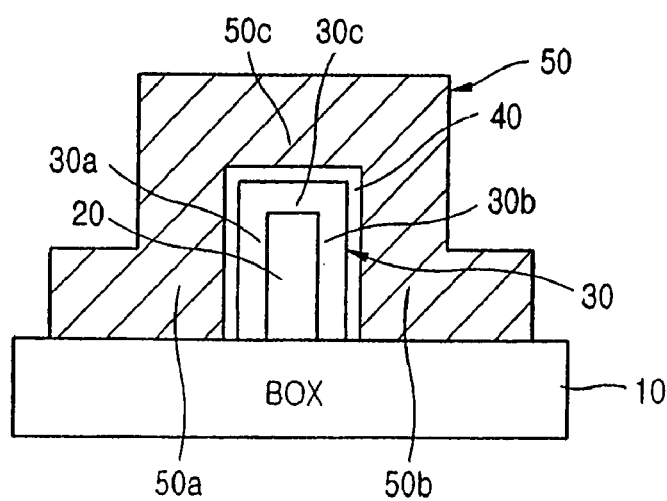
FIG. 2 is a sectional view of the non-planar transistor of FIG. 1 along the line II-II'.

FIG. 1 is a perspective view illustrating a non-planar transistor according to a first embodiment of the present invention. FIG. 2 is a sectional view of the non-planar transistor of FIG. 1 along the line II-II', and FIG. 3 is a sectional view of the non-planar transistor of FIG. 1 along the line III-III'.

Figure 3:
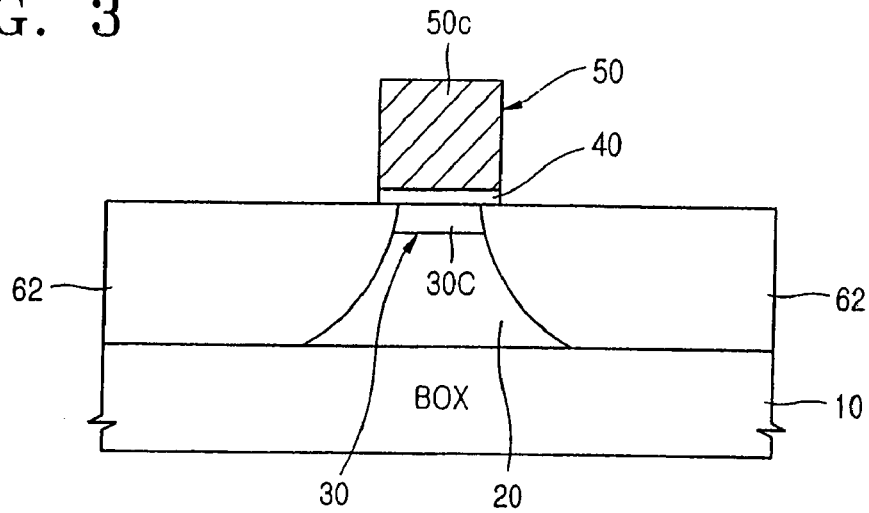
FIG. 3 is a sectional view of the non-planar transistor of FIG. 1 along the line III-III'.

Referring to FIGS. 1 through 3, the non-planar transistor according to the first embodiment of the present invention is formed on a buried oxide film (BOX) 10 of a silicon on insulator (SOI) substrate. Here, the substrate may be formed by a separation by implantation of oxygen (SIMOX) process. The BOX 10 is formed to a thickness of, for example, about 1,000 to 1,500 Å. The non-planar transistor according to the first embodiment of the present invention includes a silicon body 20, which is formed by patterning an SOI layer of the SOI substrate in order to form a mesa type active region on the BOX 10. The silicon body 20 extends from the BOX 10 with a rectangular shape. The silicon body 20 has sidewalls perpendicular to the upper surface of the main surface of the BOX 10 and has an upper surface parallel with the upper surface of the main surface of the BOX 10.

A channel region 30 is formed on the sidewalls and the upper surface of the silicon body 20. The channel region 30 is formed of a material that provides greater carrier mobility than the silicon body 20, for example, germanium (Ge) or SiGe, and preferably Ge. Here, the carrier denotes an electron or a hole. The channel region 30 includes a first channel region 30a, a second channel region 30b, and a third channel region 30c. Here, the first channel region 30a and the second channel region 30b extend perpendicular to the upper surface of the BOX 10, along the sidewalls of the silicon body 20. The third channel region 30c extends parallel with the upper surface of the main surface of the BOX 10, along the upper surface of the silicon body 20. The carrier mobility in the Ge channel or the SiGe channel is greater than that in a silicon (Si) channel. The channel region 30 is formed of Ge or SiGe and includes the first, the second, and the third channel regions 30a, 30b, and 30c, so that the carrier mobility in the transistor is improved.

A gate 50 is formed on the channel region 30. The gate 50 extends orthogonally to the direction in which the silicon body 20 extends in order to cover the sidewalls and the upper surface of the silicon body 20. The gate 50 may be formed of a conductive polysilicon layer, with a metal such as tungsten (W), platinum (Pt), or aluminum (Al), a metal nitride layer such as TiN, a metal silicide layer obtained from a refractory metal such as cobalt (Co), nickel (Ni), titanium (Ti), hafnium (Hf), or Pt, or a combination of these materials. The gate 50 may also be formed in a stacked structure with a conductive polysilicon layer and a metal silicide layer thereon.

The gate 50 includes a first gate 50a formed adjacent to the first channel region 30a, a second gate 50b formed adjacent to the second channel region 30b, and a third gate 50c formed on the third channel region 30c. Here, the first gate 50a, the second gate 50b, and the third gate 50c are integrally formed, so that the first through third gates 50a, 50b, 50c are electrically interconnected.

A gate dielectric layer 40 is interposed between the channel region 30 and the gate 50. More specifically, the gate dielectric layer 40 is interposed between the gate 50 and the first channel region 30a, the second channel region 30b, and the third channel region 30c. The gate dielectric layer 40 is formed of $Ge_xO_yN_z$, $Ge_xSi_yO_z$, $SiO_2$, $SiON$, or $Si_3N_4$, or a high dielectric material formed of a metal oxide such as $HfO_2$, $ZrO_2$, $Al_2O_3$, $TiO_2$, or $Ta_2O_5$. The gate dielectric layer 40 may also be formed in a stacked structure including two or more of these materials.

As shown in FIG. 3, source/drain regions 62 are disposed on the both sides of the channel region 30 on the silicon body 20. Here, only the third channel region 30c is illustrated in FIG. 3. The transistor shown in FIGS. 1 through 3 can be used as an NMOS transistor or a PMOS transistor. The source/drain regions 62 are doped with an n-type impurity or a p-type impurity depending on the MOS type of the transistor. In addition, insulating spacers may be formed on the sidewalls of the gate 50.

Figure 4:
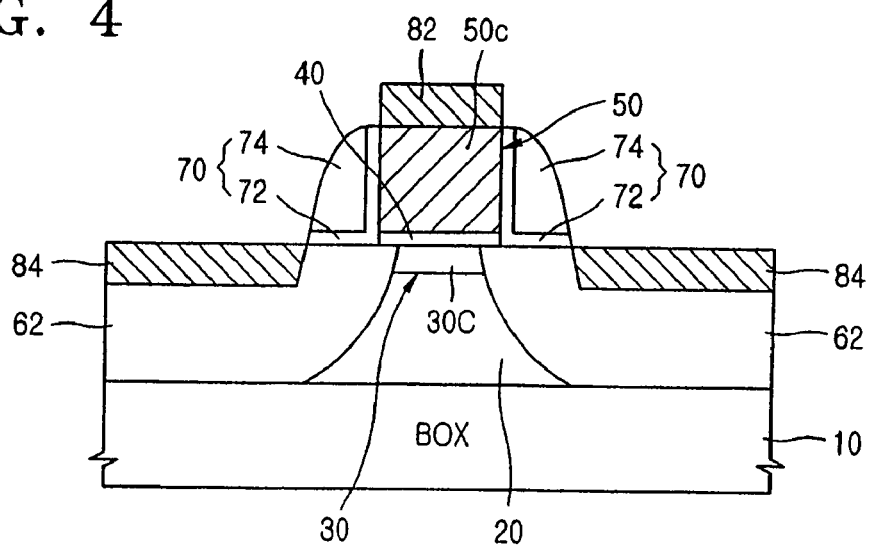
FIG. 4 is a sectional view illustrating a non-planar transistor according to a second embodiment of the present invention.

FIG. 4 is a sectional view illustrating a non-planar transistor according to a second embodiment of the present invention. Here, the sectional view corresponds to the sectional view of FIG. 3 along the line III-III' of FIG. 1. The structure of the non-planar transistor shown in FIG. 4 is the same as the structure of the non-planar transistor shown in FIGS. 1 through 3, except for a first metal silicide layer 82 and a second metal silicide layer 84 formed on the gate 50 and the source/drain regions 62, respectively.

More specifically, the first metal silicide layer 82 and the second metal silicide layer 84 are formed after insulating spacers 70 are formed on the both sides of the gate 50, in order to reduce a sheet resistance and a contact resistance. Here, the first metal silicide layer 82 and the second metal silicide layer 84 may be formed of a metal silicide such as Co, Ni, Ti, Hf, Pt, or W.

The insulating spacer 70 is formed of a silicon oxide layer 72 and a silicon nitride layer 74. However, the structure can be varied in many different forms. Further, insulating spacers corresponding to the insulating spacer 70 may be formed on the both sides of the gate 50 of FIGS. 1 through 3.

As described above with reference to FIGS. 1 through 4, the non-planar transistor according to exemplary embodiments of the present invention includes tri-gate structure in which the first gate 50a, the second gate 50b, and the third gate 50c are formed on the SOI substrate, so that the SCE can be prevented by controlling the gate even when the length of the gate is reduced due to scaling down the semiconductor device. In addition, the tri-gate structure adopts the Ge channel, so that the carrier mobility in the channel improves. In particular, the non-planar transistor adopts the multi-gate transistor structure to effectively control the SCE and uses Ge in forming the channel to improve the carrier mobility. Accordingly, excellent performance of the transistor can be maintained even when a highly integrated device having a gate with a length of less than 30 nm is manufactured.

Hereafter, a method of manufacturing the non-planar transistor of FIG. 1 according to the present invention will be described with reference to FIGS. 5a through 5d.

Figure 5A:
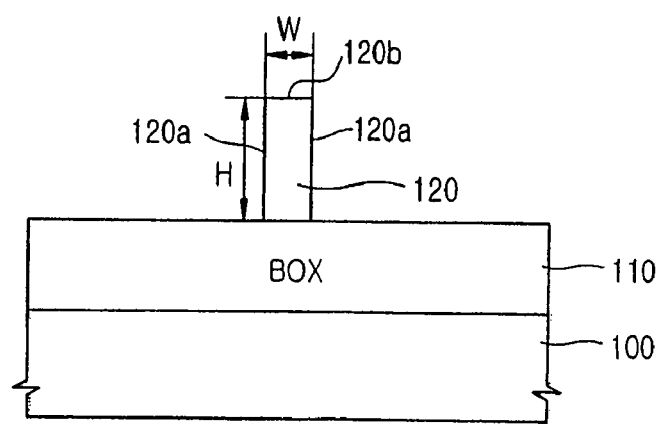
FIGS. 5A through 5D are sectional views illustrating a method of manufacturing the non-planar transistor according to the present invention.

Referring to FIG. 5A, an SOI substrate in which a silicon substrate 100, a BOX 110, and an SOI layer are sequentially formed is prepared. An SOI substrate formed by an SIMOX process may be used as the SOI substrate. The thickness of the BOX 110 is, for example, about 1,000 to 1,500 Å.

The SOI layer is etched using a photoresist pattern or a hard mask pattern as an etch mask, and a silicon body 120 is formed on the BOX 110, providing a mesa type active region. The silicon body 120 includes sidewalls 120a that extend perpendicular to the upper surface of the main surface of the silicon substrate 100 and an upper surface 120b that extends parallel with the upper surface of the silicon substrate 100.

It is preferable that the width W of the upper surface 120b of the silicon body 120 is less than 50 nm, and the height H of the silicon body 120 is less than 70 nm. In FIG. 5a, the height H of the silicon body 120 is illustrated to be greater than the width W of the silicon body 120, however, the relationship between the width W and the height (H) can be varied. For example, the height (H) of the silicon body 120 can be equal to or less than the width (W) of the upper surface 120b.

Figure 5B:
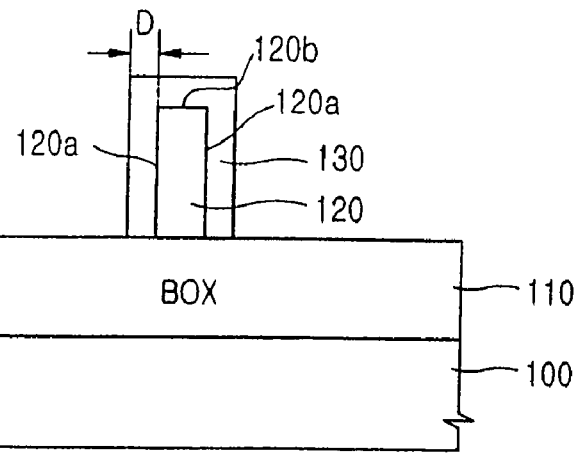

Referring to FIG. 5B, a channel region 130 that covers the sidewalls 120a and the upper surface 120b of the silicon body 120 is formed by a selective epitaxy growth method. Here, the channel region 130 is formed of Ge or SiGe, and preferably Ge. In order to form the channel region 130 with Ge, $GeH_4$ may be used as a Ge source gas. The channel region 130 may be also formed by a selective epitaxy method, such as a molecular beam epitaxy (MBE) method, an ultra high vacuum chemical vapor deposition (UHV-CVD) method, or a rapid thermal chemical vapor deposition (RTCVD) method.

It is preferable that the thickness (D) of the channel region 130 is less than 70 nm.

As described with reference to FIGS. 1 through 3, the channel region 130 includes the first channel region 30a and the second channel region 30b that extend along the sidewalls of the silicon body 120 and the third channel region 30c of FIG. 2 that extends along the upper surface of the silicon body 120.

Figure 5C:
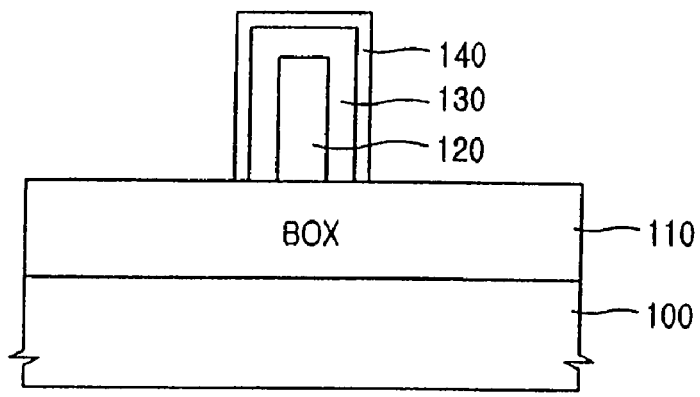

Referring to FIG. 5C, a gate dielectric layer 140 is formed on the channel region 130. Here, the gate dielectric layer 140 is formed by growing a desired layer from the surface of the channel region 130 using a thermal oxide method. The gate dielectric layer 140 can also be formed by a chemical vapor deposition (CVD) method or an atomic layer deposition (ALD) method. For example, the gate dielectric layer 140 may be formed of $Ge_xO_yN_z$, $Ge_xSi_yO_z$, $SiO_2$, $SiON$, $Si_3N_4$, or a high dielectric material including a metal oxide such as $HfO_2$, $ZrO_2$, $Al_2O_3$, $TiO_2$, or $Ta_2O_5$. The gate dielectric layer 140 may also be formed by accumulating two or more of these materials.

Figure 5D:
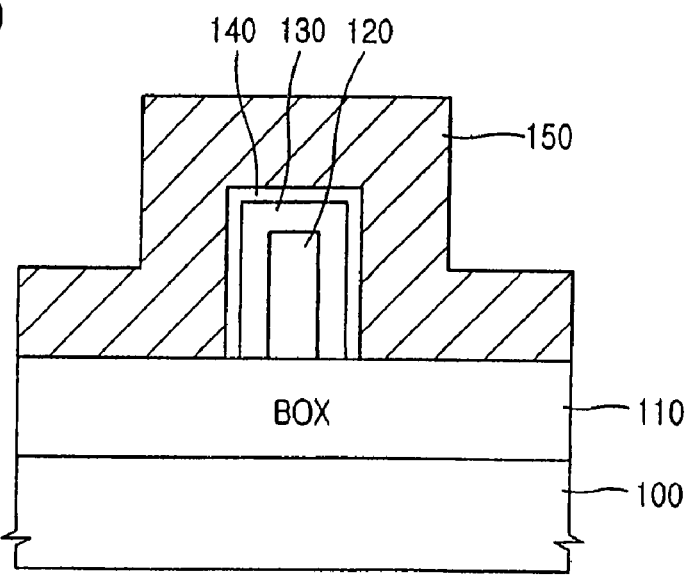

Referring to FIG. 5D, a conductive layer 150 for forming a gate is formed on the gate dielectric layer 140. The conductive layer 150 may be formed of a conductive polysilicon layer, a metal layer, a metal nitride layer, or a metal silicide layer.

Thereafter, the conductive layer 150 is patterned to form the gate 50 as shown in FIGS. 1 through 3. Here, while the channel region 130 and the gate dielectric layer 140, which form the active region, are interposed between the silicon body 120 and the gate 50, the conductive layer 150 is patterned to form the gate 50 that covers the sidewalls and the upper surface of the silicon body 120. Accordingly, the structure of FIG. 1 is formed.

Thereafter, the insulating spacer 70 is formed by a conventional process, and an ion implantation process and an annealing process are performed to form the source/drain regions 62 as shown in FIG. 4. In addition, when necessary, the metal silicide layer may be formed on the upper surfaces of the gate and the source/drain regions by performing a conventional salicide process.

According to exemplary embodiments of the present invention, a non-planar transistor has a tri-gate structure, which is realized on the SOI substrate and includes a channel region formed of Ge, thereby improving carrier mobility of the channel. Since the transistor according to the exemplary embodiments of the present invention adopts the non-planar tri-gate structure, the SCE can be easily prevented by controlling the gate even when the length of the gate is reduced due to scaling of the semiconductor device. Thus, excellent performance of the transistor can be maintained even when manufacturing a highly integrated device.

While this invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of manufacturing a non-planar transistor, the method comprising:
    forming a mesa type active region with two sidewalls and an upper surface on a substrate;
    forming a channel region that covers three surfaces of the active region;
    forming a gate dielectric layer on the channel region;
    forming a gate on the gate dielectric layer; and
    forming source/drain regions within the active region.

2. The method of claim 1, wherein the active region is formed of an SOI layer.

3. The method of claim 1, wherein the channel region is formed on the surface of the active region by a selective epitaxy growth method.

4. The method of claim 3, wherein the channel region is formed of a material that provides a greater carrier mobility than the active region.

5. The method of claim 4, wherein the channel region is formed of at least one of Ge and SiGe.

6. The method of claim 4, wherein the channel region is formed of Ge.

7. The method of claim 1, wherein the channel region includes a first channel region and a second channel region, which respectively cover the two sidewalls of the active region.

8. The method of claim 1, wherein the channel region includes a first channel region and a second channel region, which respectively cover the two sidewalls of the active region and extend along surfaces perpendicular to a main surface of the substrate, and a third channel region, which covers the upper surface of the active region and extends along a surface parallel to the main surface of the substrate.

9. The method of claim 8, wherein the gate is formed to include a first gate formed on the first channel region, a second gate formed on the second channel region, and a third gate formed on the third channel region.

10. The method of claim 1, wherein the gate dielectric layer is formed of $Ge_xO_yN_z$, $Ge_xSi_yO_z$, $SiO_2$, $SiON$, $Si_3N_4$, $HfO_2$, $ZrO_2$, $Al_2O_3$, $TiO_2$, $Ta_2O_5$ or a combination thereof.

11. The method of claim 1, wherein the gate dielectric layer is formed of a layer grown from the surface of the channel region by a thermal oxide method.

12. The method of claim 1, wherein the gate dielectric layer is formed by a chemical vapor deposition (CVD) method or an atomic layer deposition (ALD) method.

13. The method of claim 1, wherein the gate covers the two sidewalls and the upper surface of the active region with the channel region and the gate dielectric layer interposed between the gate and the active region.

14. The method of claim 1, wherein the gate is formed of at least one of a conductive polysilicon layer, a metal layer, a metal nitride layer, and a metal silicide layer.

* * * * *